(12) United States Patent
Schwerin

(10) Patent No.: US 7,321,514 B2
(45) Date of Patent: Jan. 22, 2008

(54) DRAM MEMORY CELL ARRANGEMENT

(75) Inventor: Ulrike Gruening-von Schwerin, Munich (DE)

(73) Assignee: Infineon Technologies AG, Munich (DE)

( * ) Notice: Subject to any disclaimer, the term of this patent is extended or adjusted under 35 U.S.C. 154(b) by 103 days.

(21) Appl. No.: 11/117,853

(22) Filed: Apr. 29, 2005

(65) Prior Publication Data

US 2005/0254279 A1    Nov. 17, 2005

(30) Foreign Application Priority Data

Apr. 29, 2004   (DE) ...................... 10 2004 021 051

(51) Int. Cl.
*G11C 7/10* (2006.01)

(52) U.S. Cl. .................. 365/189.01; 365/149; 365/104

(58) Field of Classification Search ........... 365/189.01, 365/149, 104, 185.23, 185.27, 63, 72

See application file for complete search history.

(56) References Cited

U.S. PATENT DOCUMENTS

| | | | |
|---|---|---|---|
| 5,414,654 A * | 5/1995 | Kubota et al. .............. | 365/145 |
| 6,262,448 B1 | 7/2001 | Enders et al. | |
| 6,638,812 B2 * | 10/2003 | Schlosser et al. ........... | 438/243 |
| 6,707,706 B2 * | 3/2004 | Nitayama et al. ........... | 365/149 |
| 2003/0116784 A1 | 6/2003 | Divakaruni et al. | |
| 2004/0259312 A1 | 12/2004 | Schlosser et al. | |
| 2005/0190617 A1 * | 9/2005 | Forbes et al. ................ | 365/200 |

OTHER PUBLICATIONS

B. Goebel et al., "Fully Depleted Surrounding Gate Transistor (SGT) for 70 nm DRAM and Beyond", 2002 IEEE (4 pgs.).

\* cited by examiner

*Primary Examiner*—Richard T. Elms
*Assistant Examiner*—Dang Nguyen
(74) *Attorney, Agent, or Firm*—Dicke, Billig & Czaja PLLC

(57) ABSTRACT

The present invention relates to a memory cell arrangement comprising a multiplicity of DRAM memory cells which are arranged in cell rows and cell columns and the selection transistor of which comprises in each case a first gate electrode and also a rear side electrode. The memory cell arrangement contains word lines and also rear side electrode lines which are arranged in each case alternately between adjacent cell columns. The invention provides for in each case the first gate electrodes of adjacent cell columns to be connected to the word line lying between the cell columns and in each case the rear side electrodes of adjacent cell columns to be connected to the rear side line lying between the cell columns. All the rear side lines are held at a constant potential, while for reading from a memory cell that word line is addressed to which the first gate electrode of the memory cell to be read is connected.

19 Claims, 16 Drawing Sheets

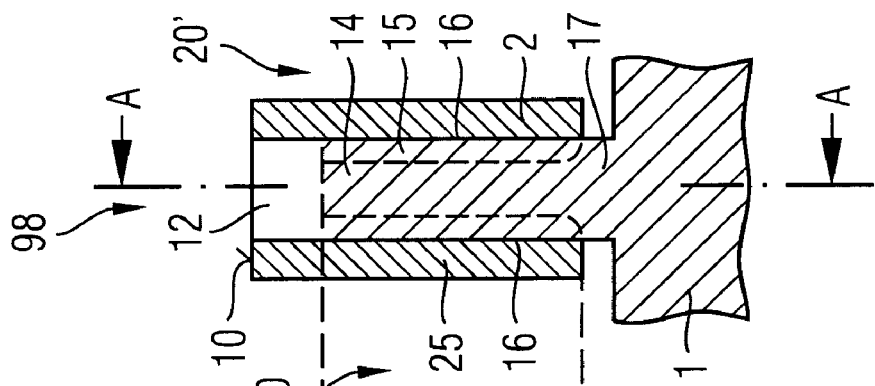
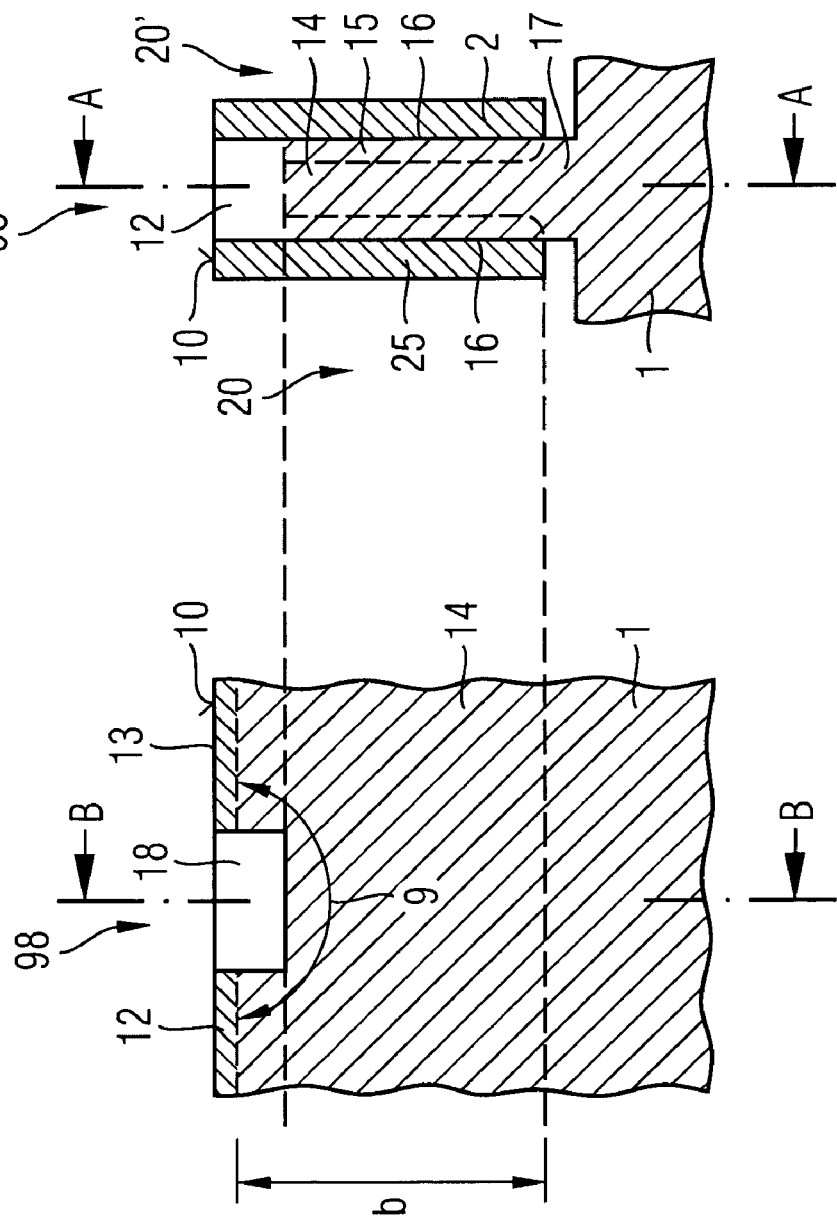

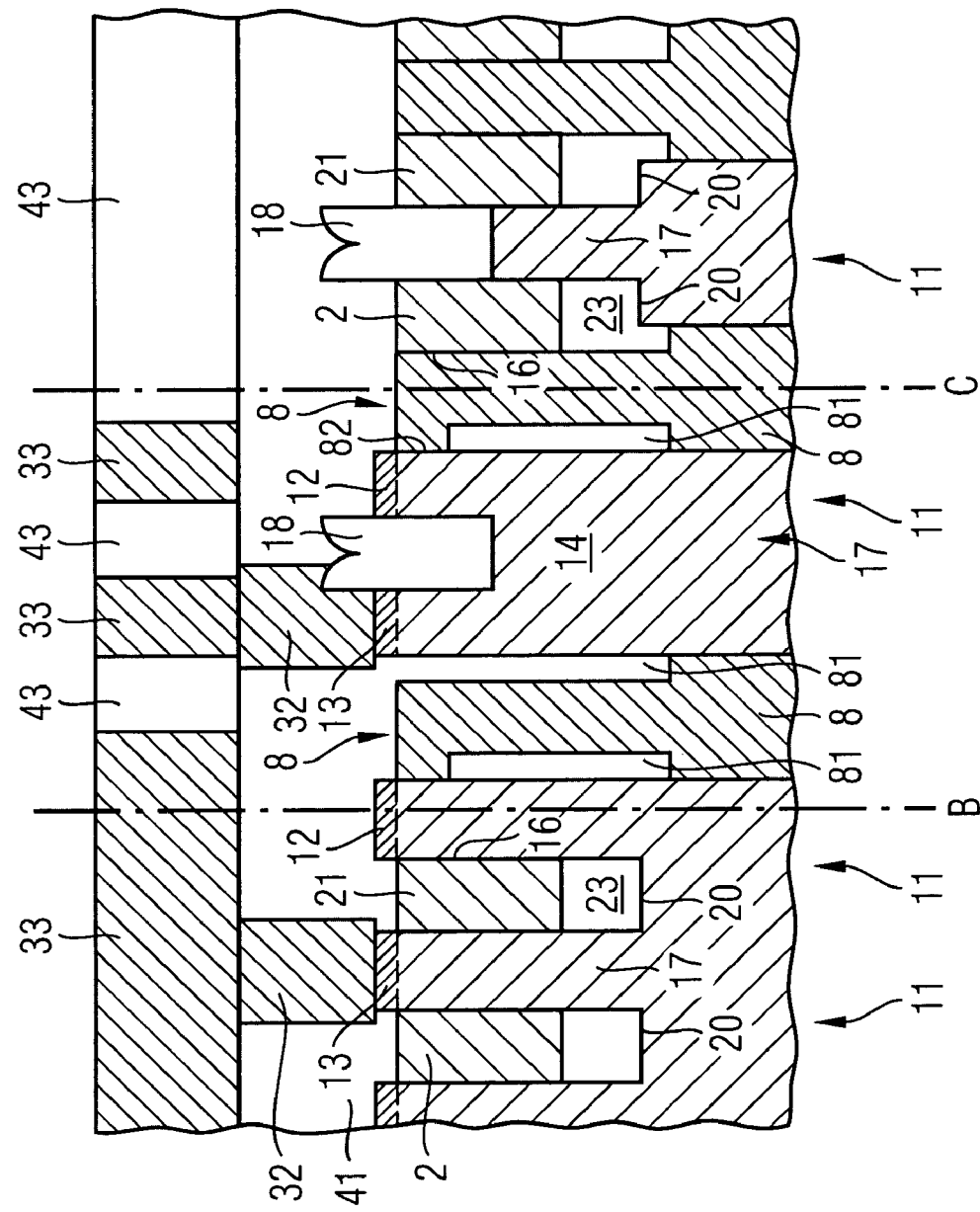

Prior Art

DRAM MEMORY CELL ARRANGEMENT

CROSS-REFERENCE TO RELATED APPLICATIONS

This Utility Patent Application claims priority to German Patent Application No. DE 10 2004 021 051.9, filed on Apr. 29, 2004, which is incorporated herein by reference.

FIELD OF THE INVENTION

The invention relates to a memory cell arrangement having a multiplicity of DRAM memory cells which are arranged in cell rows and cell columns and are formed in a semiconductor substrate, and to a method for operating a memory cell arrangement of this type.

BACKGROUND

Memory cells of dynamic random access memories (DRAMs) generally comprise a storage capacitor and a selection transistor. An item of information to be stored is stored in the storage capacitor in the form of an electrical charge, which represents a logic value 0 or 1. By driving the read-out or selection transistor via a word line, said information can be read out via a bit line. Use is made, in particular, of memory cells in which the selection transistor is realized as a field effect transistor with a first source/drain region, a second source/drain region, a conductive channel arranged between the first and second source/drain regions, and also a gate electrode.

The gate electrode is usually driven via the word line, and, by applying a suitable voltage to the gate electrode, it is possible to control the conductivity in the channel in such a way that a current flows between the first and second source/drain regions, whereas no current flows if no gate voltage is applied.

If the selection transistor is designed as a so-called double gate transistor, that is to say if a gate electrode is in each case arranged along the conductive channel on two opposite sides, the conductivity of the channel can be controlled particularly well. On the one hand, a maximum electrostatic control of the channel is achieved, as a result of which short-channel effects can also advantageously be suppressed; on the other hand, undesirable influences of adjacent lines or gate electrodes can be shielded, and the subthreshold slope of the transistor becomes smaller.

FIG. 7 illustrates a memory cell arrangement of DRAM memory cells in which the selection transistor is in each case realized as a double gate field effect transistor, in a so-called folded bit line architecture. In FIG. 7, a multiplicity of memory cells 97 are arranged in cell rows and cell columns. Each memory cell 97 comprises a storage capacitor 6 and also a selection transistor 9 connected to one of the capacitor electrodes. Each selection transistor 9 is realized as a double gate field effect transistor with two gate electrodes 2, 25. The memory cells 97 are arranged in the manner of a checkerboard pattern, the selection transistors 9 being assigned to first arrays that are diagonally adjacent to one another and the storage capacitors 6 being assigned to diagonally adjacent second arrays situated in between. A multiplicity of word lines WL1, WL2, WL3 are arranged parallel to one another in plan view. In this case, each of the word lines WL1, WL2, WL3 comprises two drive lines 96A, 96B which respectively drive the first and the second gate electrode 2, 25.

Bit lines BL1, BL1/, BL2, BL2/ are arranged perpendicular to the word lines, which bit lines run parallel to one another in plan view and are connected to the second source/drain regions of the memory cells 97. If, by way of example, the information in the storage capacitor 6 of the memory cell 97 which is situated at the crossover point between bit line BL1 and word line WL3 is then intended to be read out, a suitable voltage is applied to the word line WL3. To put it more precisely, a voltage is applied to the drive line 96A of the word line WL3, while a corresponding countervoltage is applied to the drive line 96B of the word line WL3. In this case, voltage and countervoltage are dimensioned in such a way that the channel of the selection transistor is switched to the conductive state. As a consequence, the charge stored in each of the memory cells 97 situated along the word line WL3 is transmitted to the corresponding sense amplifiers 91 via the bit lines BL1, BL2. At the same time, reference signals or dummy signals are transmitted via the adjacent bit lines BL1/, BL2/. The reference or dummy signals are signals which are transmitted if no stored information is read out from the memory cells connected to the bit lines BL1/, BL2/.

The sense amplifier 91 forms a difference from the signals transmitted via the bit lines BL1, BL1/, as a result of which interfering influences due to noise, for example, can be eliminated. The bit lines BL1/, BL2/ thus serve as reference lines during the read-out of the bit lines BL1, BL2, and vice versa.

In the case of known memory cells, the drive lines for the second gate electrode 25 and the drive line 96A for the first gate electrode of adjacent cell columns are accommodated in a word line trench 20. That is to say that two gate electrodes are arranged in a word line trench, which gate electrodes are associated with memory cells of different cell columns and therefore have to be electrically insulated from one another. This has proved to be technologically difficult to realize. Moreover, the overlap capacitance of the two word lines becomes very high on account of their close proximity.

Therefore, there is a need to provide a memory cell arrangement in which the selection transistors are realized as double gate transistors, which, however, can be fabricated by simpler methods compared with the known ones and the function of which is more reliable. There is also a need for a method for operating a memory cell arrangement of this type.

SUMMARY

Embodiments of the present invention provide a memory and method of operating the memory. In one embodiment, the invention provides a memory cell arrangement having a plurality of memory cells defined by a plurality or cell rows and cell columns, each cell column having a gate electrode; and a plurality of word lines and rear side electrode lines arranged alternately between adjacent cell columns. The gate electrode of adjacent cell columns is connected to a word line between the adjacent cell columns.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 4A-4B illustrate two cross sections through a transistor structure to which the memory cell arrangement according to the invention can be applied.

FIGS. 5A-5E illustrate various views of a memory cell arrangement in accordance with a second embodiment of the invention.

DETAILED DESCRIPTION

Figure 1:
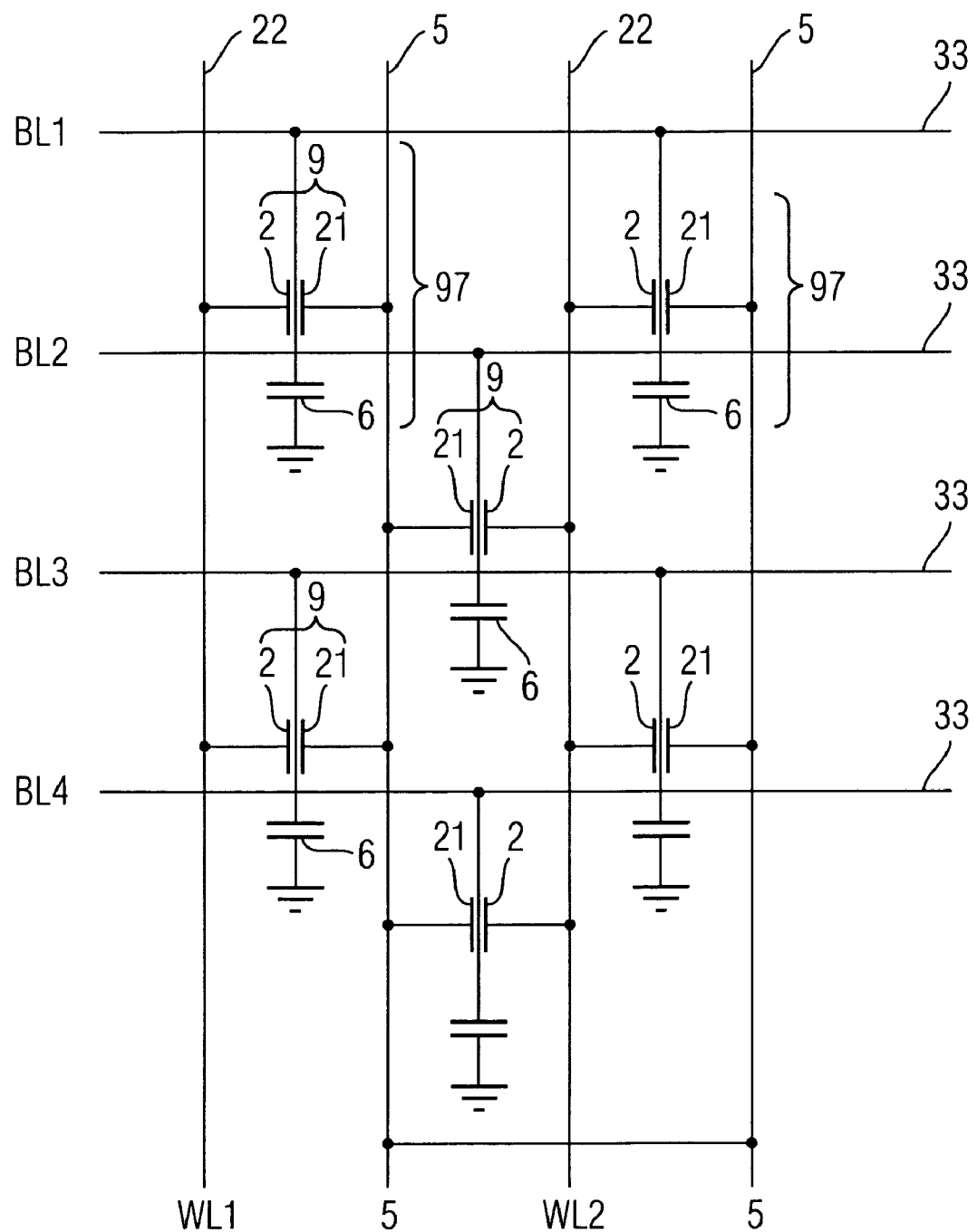
FIG. 1 illustrates a plan view of one embodiment of a cell architecture according to the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides a memory cell arrangement, including a multiplicity of memory cells which are arranged in cell rows and cell columns, formed in a semiconductor substrate and in each case contain a storage capacitor for storing electrical charge and a selection transistor for driving the storage capacitor. A multiplicity of bit lines are arranged in a first direction, and a multiplicity of word lines are arranged in a second direction, which intersects the first direction. A multiplicity of rear side electrode lines are arranged in the second direction, the direction defined by the cell columns corresponding to the second direction, the word lines and rear side electrode lines being arranged in such a way that in each case one rear side electrode line lies between two word lines and in each case one word line lies between two rear side electrode lines. The selection transistor includes a first and a second source/drain region, a conductive channel that connects the first and the second source/drain region, a first gate electrode, which is suitable for controlling the conductivity of the conductive channel, and also a second rear side electrode opposite the first gate electrode. The storage capacitor includes two storage electrodes and also a storage dielectric arranged between the storage electrodes, and the first source/drain region of each memory cell being connected to a storage electrode of the associated storage capacitor. The second source/drain region of each memory cell is connected to a bit line, the bit line being suitable for transmitting the electrical charge read out. Each word line is arranged between two cell columns being connected to the first gate electrodes of the memory cells of the adjoining cell columns and being suitable in each case for driving the first gate electrodes for initiating a read-out operation, and each rear side electrode line is arranged between two cell columns being connected to the rear side electrodes of the memory cells of the adjoining cell columns and being suitable in each case for holding the rear side electrodes at a fixed potential.

Embodiments of the present invention provide an arrangement of DRAM memory cells in which word lines and rear side electrode lines are arranged alternately between adjacent cell columns. The invention provides for the first gate electrodes of the two adjacent cell columns to be connected to the word line lying between the cell columns and the rear side electrodes of the two adjacent cell columns to be connected to the rear side line lying between the cell columns. All the rear side lines are held at a constant potential, while for reading from a memory cell that word line is addressed to which the first gate electrode of the memory cell to be read is connected.

In the case of the memory cell arrangement according to the invention, the number of word lines is drastically reduced, thereby avoiding problems of mutual insulation and overlap capacitances occurring. As a consequence, the fabrication method is significantly simplified, and further structure miniaturizations can be performed more easily.

In particular, in accordance with the present invention, the storage capacitors and the selection transistors may be arranged in the manner of a checkerboard pattern, the selection transistors being assigned in each case to first arrays that are diagonally adjacent to one another and the storage capacitors being assigned in each case to diagonally adjacent second arrays situated in between.

In accordance with the present invention, the storage capacitors may comprise trench capacitors formed in the semiconductor substrate.

The selection transistor may be embodied, for example, as a vertical transistor, the channel of which runs perpendicularly to a substrate surface of the semiconductor substrate.

In accordance with the present invention, the storage capacitor may be embodied as a stacked capacitor above a substrate surface of the semiconductor substrate.

According to the invention, it is provided, for example, that the selection transistor is embodied as a transistor whose first and second source/drain regions are isolated from one another by a nonconductive recess structure along an X axis defined by the first and second source/drain regions. The length of the conductive channel can advantageously be lengthened as a result.

In particular, the first gate electrode and the rear side electrode of the selection transistor may extend along the x axis at least from the first as far as the second source/drain region and along a direction perpendicular to the substrate surface at least from the underside of the first and the second source/drain region to beyond a lower edge of the recess structure. As a result, the width of the conductive channel can advantageously be set by the extent of the first gate electrode and of the rear side electrode in a direction perpendicular to the substrate surface.

Preferably, word line trenches are arranged between two cell columns, a word line and a rear side electrode line being arranged alternately in said word line trenches. In particular, the first gate electrode and also the rear side electrode are embodied as so-called sidewall electrodes, that is to say that they delimit the conductive channel of the selection transistor laterally, more precisely in a direction perpendicular to the substrate surface. As a result, the selection transistors of adjacent cell columns can be electrostatically shielded from one another particularly well.

Each rear side electrode line is held at a fixed potential during operation of the memory cell arrangement independently of whether or not the memory cells present on the respective rear side electrode line are currently intended to be addressed, said fixed potential ensuring that the channel is not conductive as long as a corresponding voltage has not been applied to the first gate electrode. Accordingly, at least two rear side electrode lines, but in particular also all the rear side electrode lines, may be connected to one another. By way of example, all the rear side electrode lines may also be grounded.

This affords the advantage of ensuring that all the rear side electrodes are actually held at the same potential. A further advantage produced is that the electrical contact-connection at the cell array edge can be implemented in a particularly space-saving fashion.

The present invention furthermore provides a method for operating a memory cell arrangement of this type, including applying a voltage that remains constant to all the rear side electrode lines, applying a voltage to a word line to which the first gate electrode of the memory cell to be read is connected, the voltage being suitable for controlling the first gate electrode of the selection transistor in such a way that the conductive channel becomes conductive, as a result of which the content of the memory cell to be read is read out.

The voltage that remains constant which is applied to all the rear side electrode lines is typically negative in this case. It is selected in such a way that the conductive channel of the selection transistor is not conductive as long as the first gate electrode of the selection transistor has not been activated via the word line. As a consequence, it is ensured that only those memory cells whose first gate electrode has been addressed via the word line are read.

FIG. 1 illustrates a cell architecture of a memory cell arrangement according to one embodiment of the invention. A multiplicity of memory cells 97 are arranged in cell rows and cell columns, each memory cell comprising a storage capacitor 6 and a selection transistor 9. Since the definition of what is to be designated as cell column and what is to be designated as cell row is arbitrary, it is stipulated that the direction of the cell columns is the direction in which the word lines run as well. That is to say that, depending on the illustration chosen, cell columns may also run horizontally or diagonally from bottom left to top right if the associated word lines likewise run horizontally or diagonally from bottom left to top right.

The memory cells are arranged in the form of a checkerboard pattern. The selection or read-out transistor 9 of each memory cell 97 has a first gate electrode and also a rear side gate electrode 21. Unlike in FIG. 7, however, the rear side gate electrodes 21 of the first cell column are connected via a rear side electrode line 5 to the left-hand side gate electrodes of the memory cells of the second cell column. The memory cell architecture illustrated in FIG. 1, accordingly, has word lines WL1 and WL2 to which a predetermined voltage can be applied upon selection of a specific memory cell. Furthermore, the cell architecture comprises rear side electrode lines 5 which connect the rear side gate electrodes of adjacent memory cell columns to one another and which are always held at a constant voltage, independently of whether or not the associated first gate electrode is intended to be addressed. In this case, the constant voltage is dimensioned in such a way that the conductive channel of the selection transistor is not conductive as long as no gate voltage has been applied to the first gate electrode. As soon as a voltage is applied to the first gate electrode, the channel becomes conductive and the charge stored in the storage capacitor is read out.

In accordance with the present invention, as illustrate in FIG. 1, two adjacent word lines are replaced by a common line. The common line is connected to the gate electrodes of the two adjacent cell columns. In this case, every second common line acts as an active word line for reading and writing via which a gate voltage can be applied to the gate electrodes connected to it. The remaining common lines situated between the active word lines serve as a common rear side gate electrode and are held at a constant voltage.

The fact that in each case two adjacent word lines are replaced by one common line means that the method for fabricating the memory cell arrangement can be considerably simplified; in particular, it is not necessary for the two previously adjacent word lines to be insulated from one another by insulating material and problems associated with an inadequate insulation can be avoided. Moreover, an overlap capacitance no longer occurs between the previously adjacent word lines. As a consequence, further structure miniaturizations can be performed on the resulting memory cell arrangement without calling its practical implementability into question.

If, in the case of the arrangement illustrated in FIG. 1, the memory cell 97 arranged at the crossover point between word line WL2 and bit line BL1 is then intended to be read, a predetermined voltage is applied to the word line WL2 and the charge stored in the storage capacitor 6 is read out via the bit line BL1.

Figure 7:
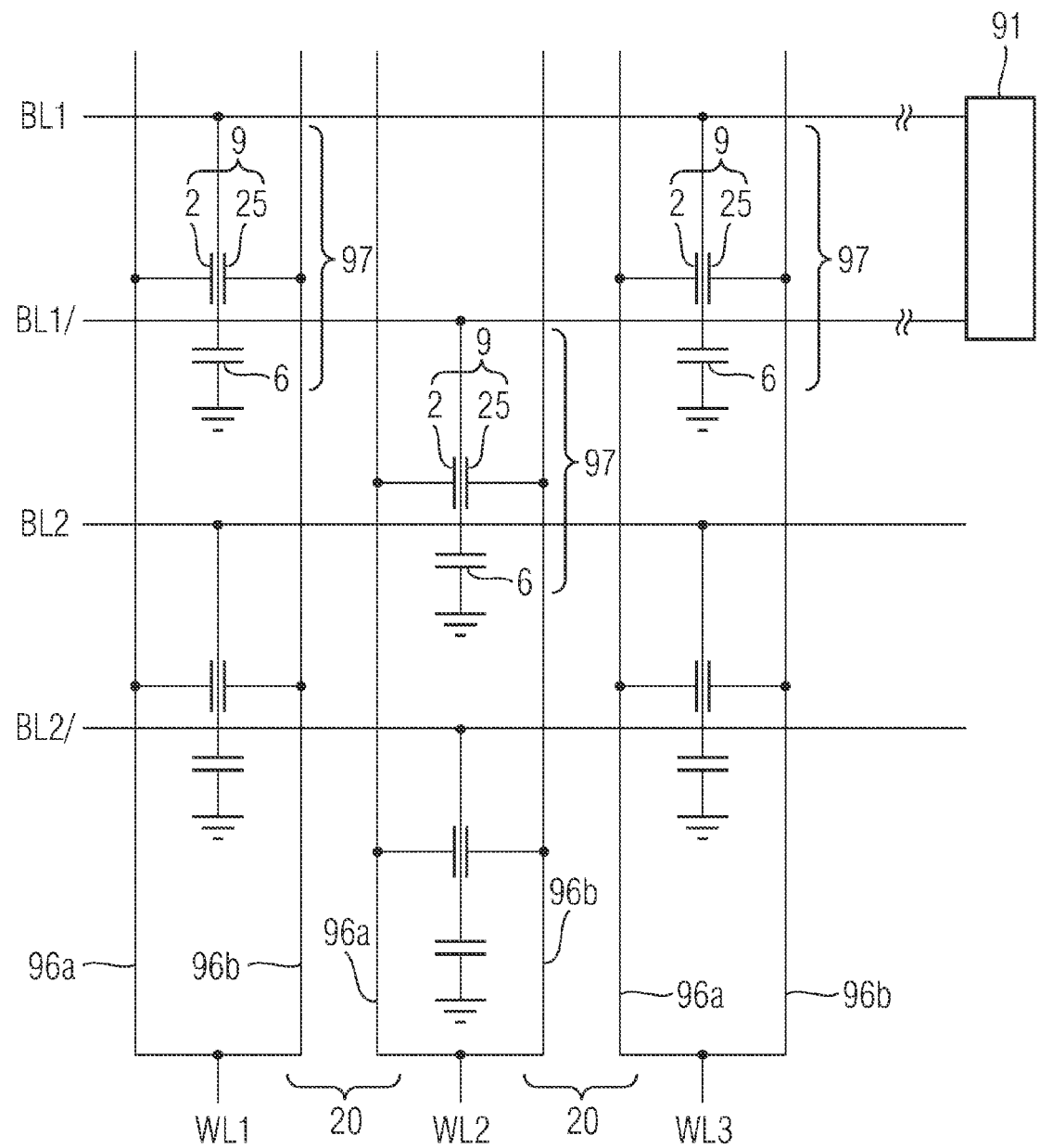
FIG. 7 illustrates a view of a conventional memory cell arrangement in accordance with a folded bit line architecture.

Unlike in the case of the cell architecture illustrated in FIG. 7, however, here the bit line BL2 cannot serve as a reference bit line since, as a result of the driving of the word line WL2, the memory cell situated at the crossover point between the bit line BL2 and the word line WL2 is also driven and read. Consequently, the bit line BL2 does not supply a "dummy" signal corresponding to a signal without any read-out information. This cell architecture is referred to as an open bit line architecture.

Figure 2A:
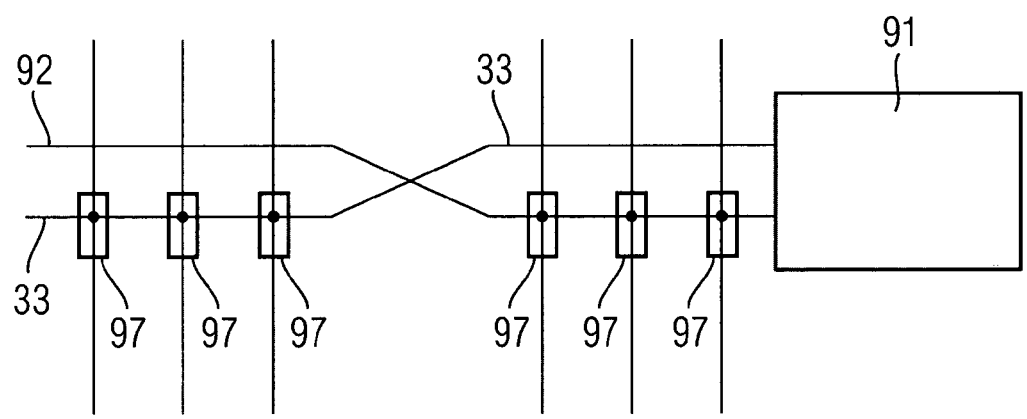
FIG. 2A-2B illustrates exemplary arrangements of the bit line for increasing the read-out accuracy.

The disadvantage described can be eliminated, for example, if, as illustrated in FIG. 2A, a reference bit line is introduced in a second bit line plane. FIG. 2A illustrates a cell architecture in which, by way of example, a reference bit line 92 is provided in a higher metallization plane and crosses the first bit line 33, so that an identical number of memory cells 97 are connected to each of the two bit lines 33, 92. When a specific memory cell is addressed, the signal of the bit line 33 can be compared with the signal of the reference bit line 97 in the sense amplifier 91.

Figure 2B:
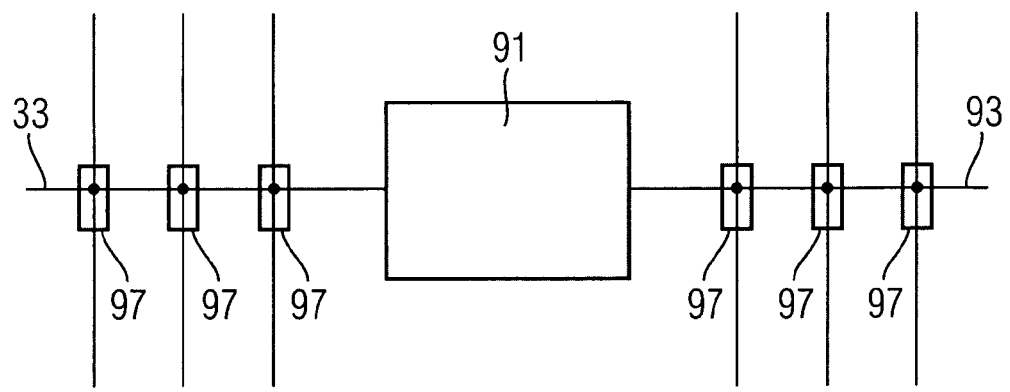

FIG. 2B illustrates a further possibility for introducing a reference bit line 93. The bit line of an adjacent memory cell arrangement that is inactive at the instant of reading is used as a reference bit line in this case.

As will be set forth below, the memory cell arrangement illustrated in FIG. 1 can be realized with various types of memory cells which in each case contain different storage capacitors and selection transistors.

FIG. 3 illustrates an embodiment of the present invention in which the memory cells in each case comprise a storage capacitor embodied as a trench capacitor and a selection transistor realized as a vertical transistor.

Figure 3A:
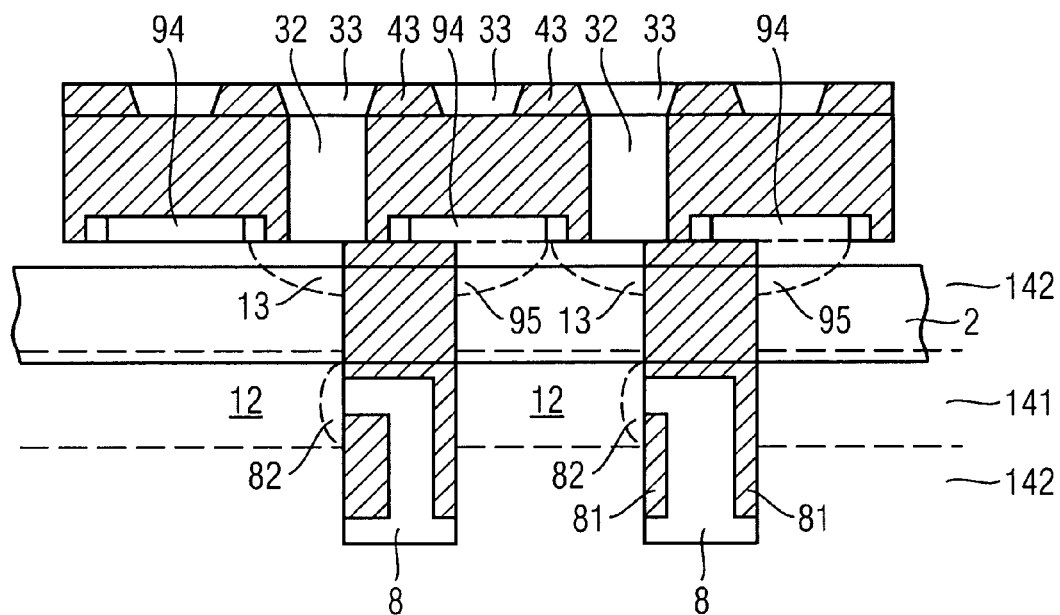
FIGS. 3A-3C illustrate various views of a memory cell arrangement according to the invention in accordance with a first embodiment of the invention.

FIG. 3A illustrates a cross-sectional view along a word line 2, i.e. a view perpendicular to the bit lines 33. Reference symbol 8 designates a trench capacitor with an insulation collar 81 for turning off a parasitic transistor in the upper trench region. The inner capacitor electrode (not illustrated) is connected to the selection transistor 9 via a contact window or buried strap region 82. The selection transistor comprises a first source/drain region 12, a second source/drain region 13 and also a gate electrode 2. The p-doped transistor body 142 is connected to a p-doped well region 94 via a p-doped region 95. The p-doped well region 94 is provided in order to avoid so-called floating body effects. The second source/drain region 13 is connected to a bit line 33 via a bit line contact 32. A dielectric material 43 is in each case provided between adjacent bit lines for insulation purposes.

Figure 3B:
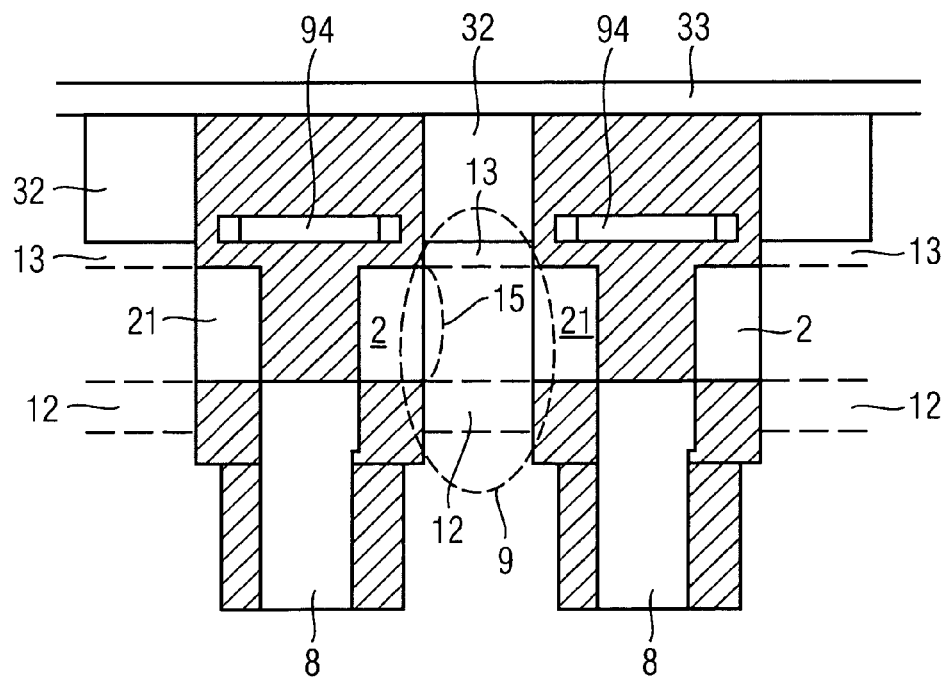

FIG. 3B illustrates a view of the memory cells according to the invention perpendicular to a word line, i.e. parallel to a bit line. The vertical orientation of the selection transistor 9 with a first source/drain region 12, a second source/drain region 13 and the conductive channel 15 arranged in between can be discerned in FIG. 3B. The first gate electrode 2 is situated on the left-hand side of the selection transistor 9, and the rear side gate electrode 21 is situated on the right-hand side. Both gate electrodes are embodied as side wall gate electrodes, that is to say that they delimit the conductive channel laterally. The remaining reference symbols designate the same components as in FIG. 3A.

Upon application of a suitable voltage to the gate electrode 2, the conductive channel 15 in FIG. 3B is opened and a read-out operation is initiated at the corresponding memory cell. The charge stored in the storage capacitor 8 is read out via the buried strap region 82 and passes via the first source/drain region 12, the conductive channel 15, the second source/drain region 13, the bit line contact 32 onto the corresponding bit line 33.

Figure 3C:
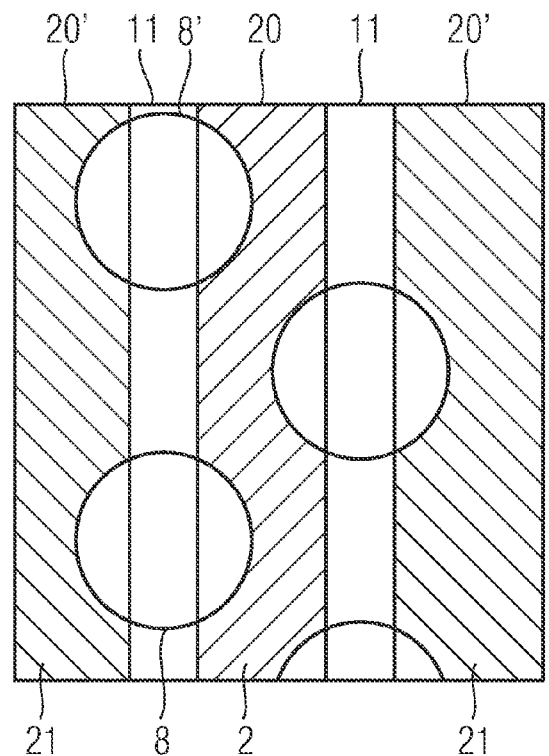

FIG. 3C illustrates a plan view of the memory cell arrangement according to the invention in accordance with the first embodiment. In FIG. 3C, a plurality of active zones 11 are in each case arranged parallel to one another. Word line trenches 20, 20' are in each case arranged between the active zones 11. Reference symbols 8, 8' in each case designate the trench capacitors. As can be seen in FIG. 3C, a gate electrode is now formed in each of the word line trenches 20, 20', the first gate electrodes 20 and the rear side electrodes 21 being arranged alternately in each case. For the purpose of reading from a memory cell, the gate electrode 2 formed in the word line trench 20 is set to a predetermined voltage. By contrast, the rear side electrodes 21 arranged in the word line trenches 20' are kept constant at a predetermined potential.

Figure 3D:
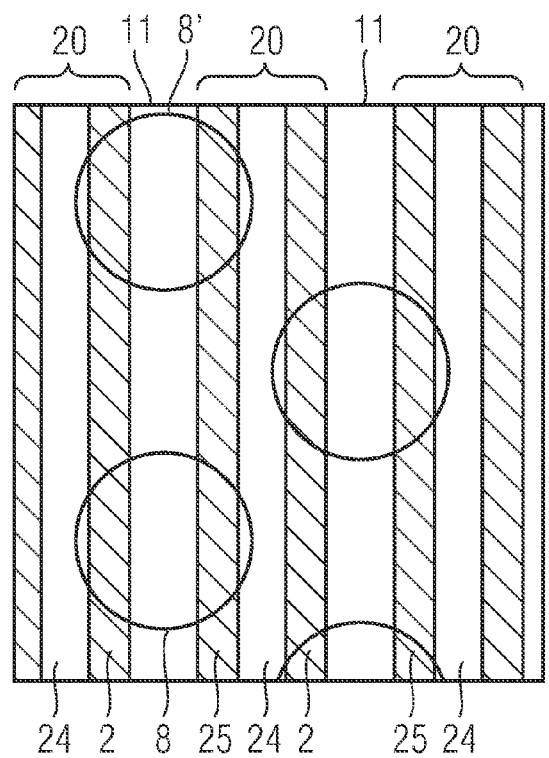
FIGS. 3D-3E illustrate corresponding views of a conventional memory cell arrangement.

FIG. 3D illustrates, in comparison thereto, the plan view of a conventional memory cell arrangement. As can be seen in FIG. 3D, a first gate electrode 2, a second gate electrode 25 and also a word line insulator structure 24 are accommodated in each word line trench 20. FIG. 3C thus illustrates a significantly simpler construction than the memory cell arrangement of FIG. 3D.

Figure 3E:
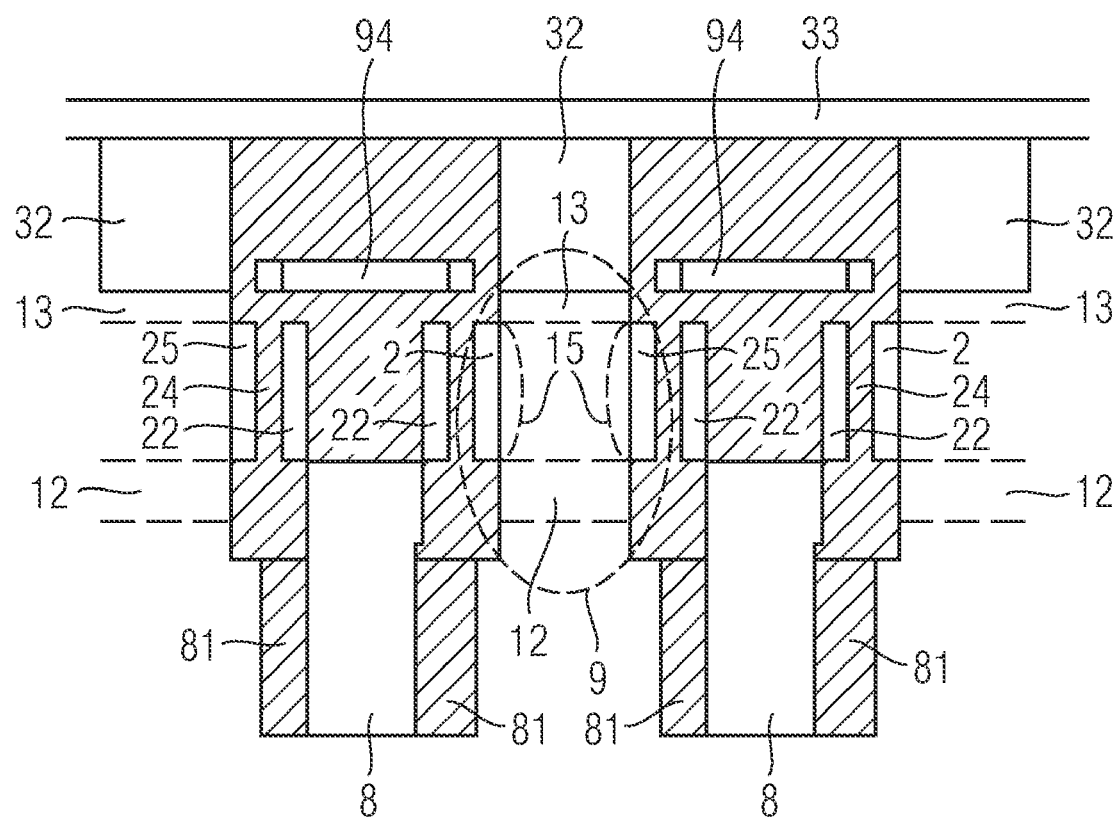

FIG. 3E illustrates for comparison a view of a conventional memory cell arrangement perpendicular to a word line corresponding to the view of FIG. 3B. In FIG. 3E, identical reference symbols in each case designate the same components as in FIG. 3B. If the illustration of FIG. 3B is compared with that of FIG. 3E, then it is evident that the structure is considerably simplified in accordance with FIG. 3B since the adjacent word lines 2 and 22, and respectively 25 and 22, illustrated in FIG. 3E are merged with one another in each case, thereby also obviating an electrical insulation of the previously adjacent word lines 2 and 22, and respectively 25 and 22, by the word line insulator structure.

The present invention may furthermore also be applied to a memory cell with a transistor having a curved channel, that is to say with a so-called CFET.

FIGS. 4A and 4B schematically illustrate the functioning of such a CFET. FIG. 4A illustrates the construction of a conventional CFET transistor structure 98 in a direction parallel to an X axis defined by the first source/drain region 12, the conductive channel 15 and the second source/drain region 13. FIG. 4B illustrates a cross-sectional view perpendicular to this defined axis.

In a semiconductor substrate 1, a first source/drain region 12 and a second source/drain region 13 are formed in a substrate surface 10 along the X axis. The two source/drain regions 12, 13 are spaced apart from one another by a recess trench 18. The recess trench 18 extends in a direction perpendicular to the substrate surface 10, from the substrate surface 10 to below a lower edge of the source/drain regions 12, 13. A body region 14 of the transistor structure 98 is formed by the semiconductor substrate 1 below the source/drain regions 12, 13. As illustrated in FIG. 4B, a respective first and second gate electrode 2, 25 are arranged on both sides of the body region 14, said gate electrodes being spatially separated and electrically isolated from the body region 14 in each case by a gate dielectric 16. The first and second gate electrodes 2, 25 respectively extend in a direction perpendicular to the substrate surface 10 essentially from the lower edge of the source/drain regions 12, 13 to below a lower edge of the recess trench 18, as specified by the variable b in FIG. 4A. The recess trench 18 may be filled with a dielectric material. As illustrated in FIG. 4B, the two gate electrodes 2, 25 are arranged in adjacent word line trenches 20, 20'.

During operation of the transistor structure 98, by means of a suitable potential at the first gate electrode 2 and the second gate electrode 25, respectively, a conductive channel 15 is formed between the two source/drain regions 12, 13 in each case in a section of the body region 14 that adjoins the gate dielectric 16. A cell current 99 flows through the channel 15. The length of the channel 15 is essentially determined by the depth of the recess structure 18. The effective channel width is determined by the extent of the gate electrode 2 in the vertical direction with respect to the substrate surface 10. The source/drain regions 12, 13 and also the body region 14 form an active zone 11, which is formed in a ridge 17 of the semiconductor substrate 1, the ridge 17 being bounded by the first and the second gate electrode 2, 25 on at least two mutually opposite sides.

FIG. 5 illustrates a second embodiment of the present invention, in which the storage capacitor is embodied as a trench capacitor and the selection transistor is realized as a CFET. FIG. 5A illustrates a cross-sectional view of the second embodiment along a word line, that is to say perpendicular to the bit lines 33. In FIG. 5A, identical reference symbols designate the same components as in FIG. 3A. In particular, reference symbol 9 designates a selection transistor which is realized as a CFET in accordance with the second embodiment. In contrast to the embodiment illustrated in FIG. 3A, the axis defined by the first source/drain region 12 and the second source/drain region 13 runs parallel to the substrate surface. The channel 15 running between first source/drain region 12 and second source/drain region 13 is arranged in a p-doped region 142. A storage electrode of the trench capacitor 8 is connected to the first source/drain region 12, and the second source/drain region 13 is connected to a bit line 33 via a bit line contact 32.

Figure 5A:
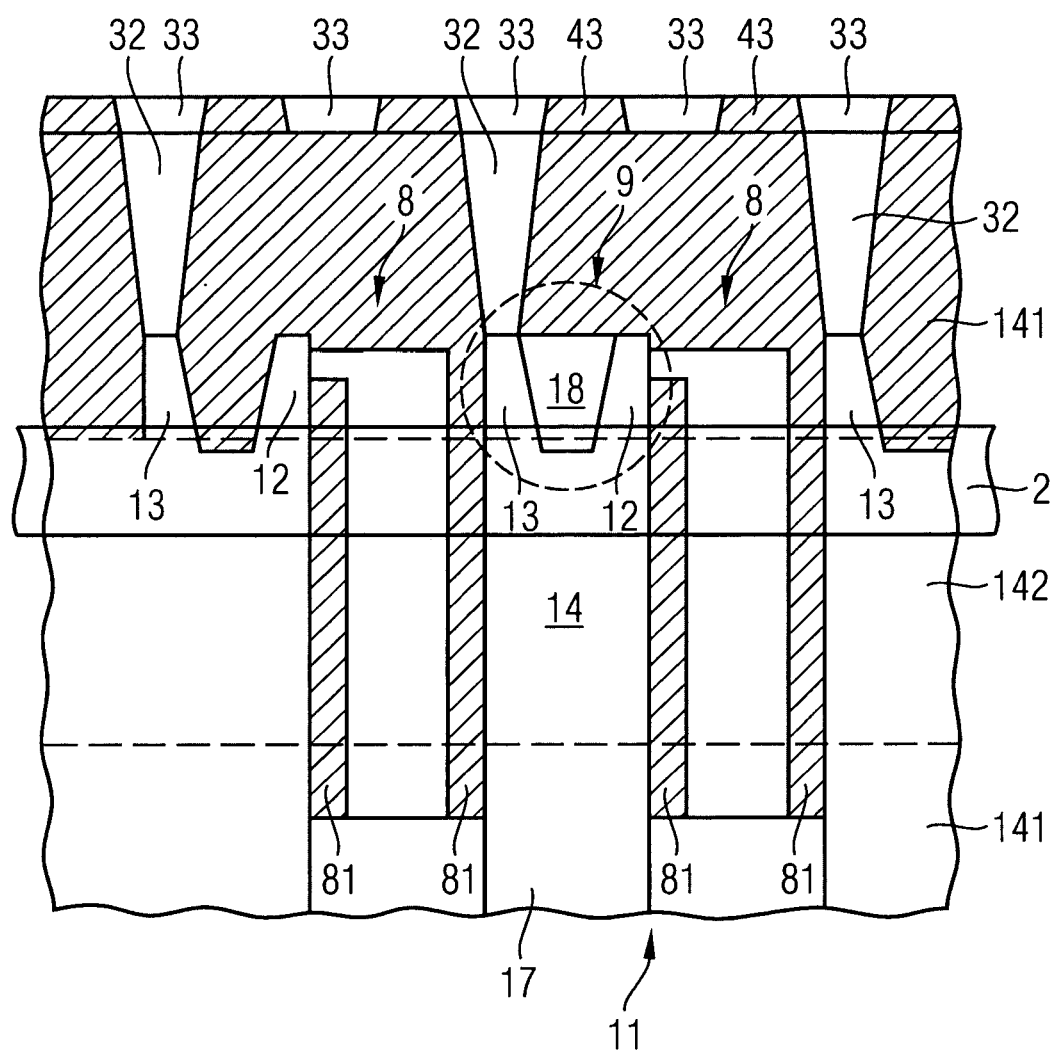
Figure 5B:
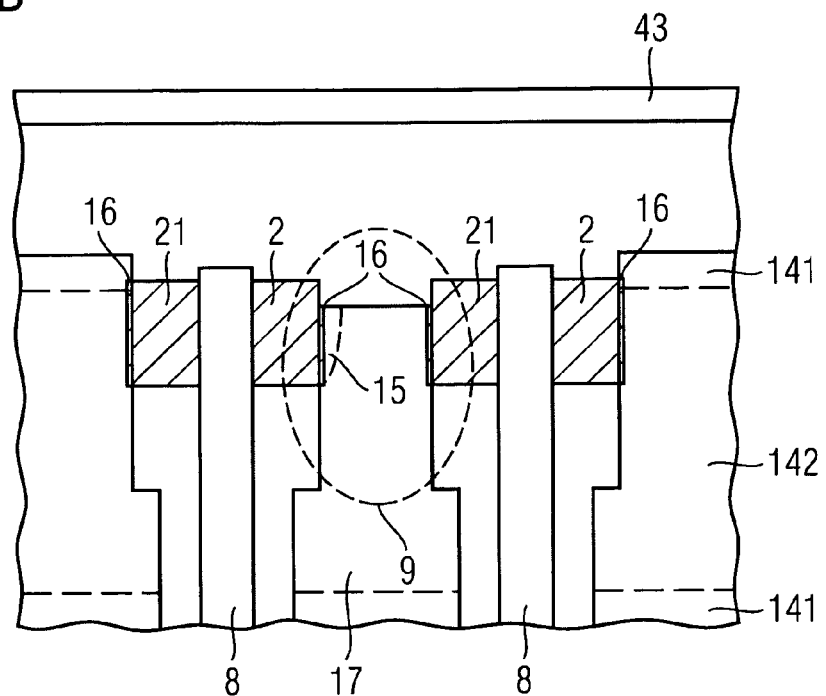

FIG. 5B illustrates a cross-sectional view perpendicular to the word lines, that is to say parallel to a bit line. FIG. 5B illustrates the first gate electrode 2 and the rear side gate electrode 21 of the selection transistor 9. Both gate electrodes 2, 21 are again embodied as sidewall electrodes and spatially separated from the conductive channel 15 by a gate dielectric 16. The selection transistor 9 is formed in a ridge 17.

During operation of the memory cell illustrated, the rear side electrode is held at a constant potential. For a read-out operation, a suitable potential is applied to the first gate electrode 2, so that a conductive channel 15 that connects the two source/drain regions 12, 13 to one another is formed in the section of the body zone 142 opposite the first gate electrode 2 at the gate dielectric 16. The effective channel length Leff of the channel 15 results from the depth of the insulating recess trench 18. The effective channel width Weff of the channel 15 results from the distance between the lower edge of the recess structure in the recess trench 18 and the lower edge of the first gate electrode 2.

Figure 5C:
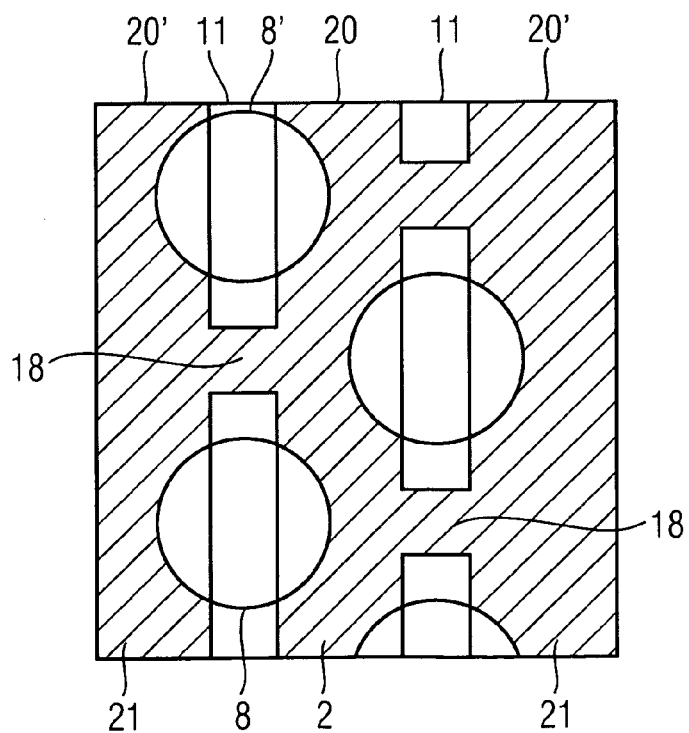

FIG. 5C illustrates a plan view of the memory cell arrangement in accordance with the second embodiment of the present invention. Active zones 11 are arranged in strip-type fashion and parallel to one another. A word line trench 20, 20' is introduced in each case between two adjacent active zones 11, said word line trench insulating the active zones from one another. The active zones 11 are interrupted by recess trenches 18 in their propagation direction. The reference symbols 8, 8' in each case designate trench capacitors. The present invention now provides for only one gate electrode 2 or 21 to be introduced in each of the word line trenches 20, 20' in such a way that in each case one rear side electrode 21 is arranged between two first gate electrodes 2 and in each case one gate electrode is arranged between two rear side electrodes. In this case, the rear side electrodes 21 arranged in the word line trenches 20' are held in each case at an identical, constant potential. In particular, the rear side electrode lines which in each case connect the rear side gate electrodes to one another may be interconnected.

Figure 5D:
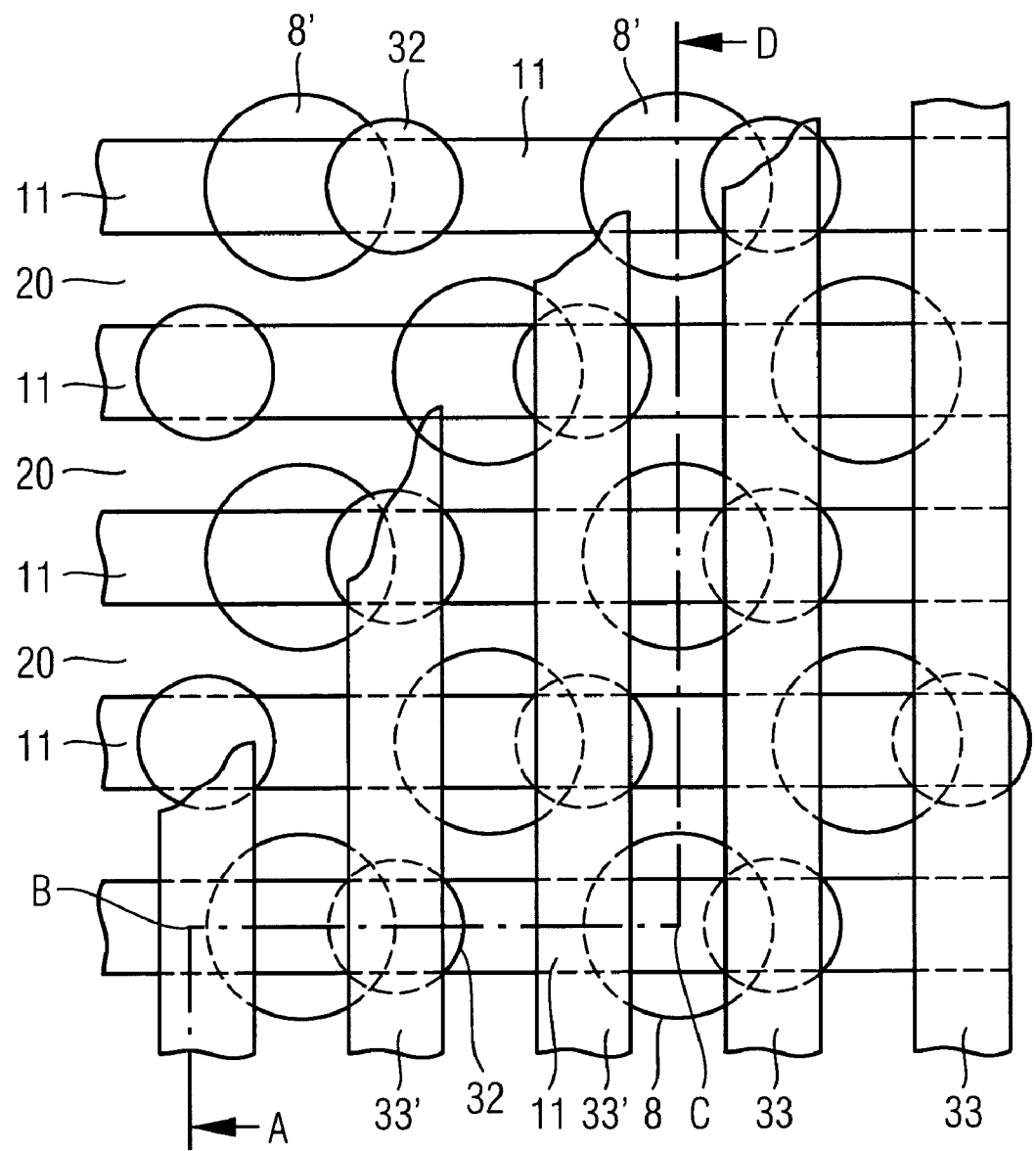

FIG. 5D illustrates a more detailed plan view of the memory cell arrangement according to the invention. It should be taken into account in this case that this illustration is rotated through 90° in comparison with the illustration illustrated in FIG. 5C. In FIG. 5D, the selection transistors are represented by active zones 11 assigned to them. The active zones 11 are arranged with the respectively assigned trench capacitors 8 in cell rows which are offset relative to one another, thus resulting in a checkered arrangement of active zones 11 and trench capacitors 8. The active zone 11 of a memory cell is delimited within a cell row by two trench capacitors 8 in each case, one of the two trench capacitors that delimit the active zone 11 having a contact window 82, in the region of which a first source/drain region 12 of the active zone 11 is connected to a storage electrode 61 in the interior of the trench capacitor 8.

The active zone 11 is insulated from the storage electrode of the other trench capacitor 8' by an insulation collar 81 provided in the interior of the trench capacitor 8. Word line trenches 20 that intersect an upper section of the trench capacitors are introduced between the cell rows formed by the trench capacitors 8 and the active zones 11. Bit or data lines 33 are routed orthogonally with respect to the word line trenches 20 and are connected via bit line contacts 32 to in each case a second source/drain region 13 of the selection transistors or the active zones. Recess trenches 18 are introduced into the active zones 11 in each case between the bit lines 33, which recess trenches in each case isolate the first source/drain regions 12 and the second source/drain regions 13 and the depth of which recess trenches prescribes an effective channel length Leff of the selection transistors.

FIG. 5E illustrates the construction of the memory cell arrangement illustrated along the cross section A-B-C-D of FIG. 5D. More precisely, the left-hand section of FIG. 5E up to the point B illustrates a cross-sectional view along a bit line, that is to say perpendicular to the word line trenches 20. In the left-hand region of FIG. 5E, a second source/drain region 13 is connected to a bit line 33 via a bit line contact 32. An interlayer dielectric 41 is provided in order to electrically insulate the bit line plane from the underlying structures. The first gate electrode 2 associated with the selection transistor and the rear side gate electrode 21 are arranged in the word line trenches 20.

Figure 5F:
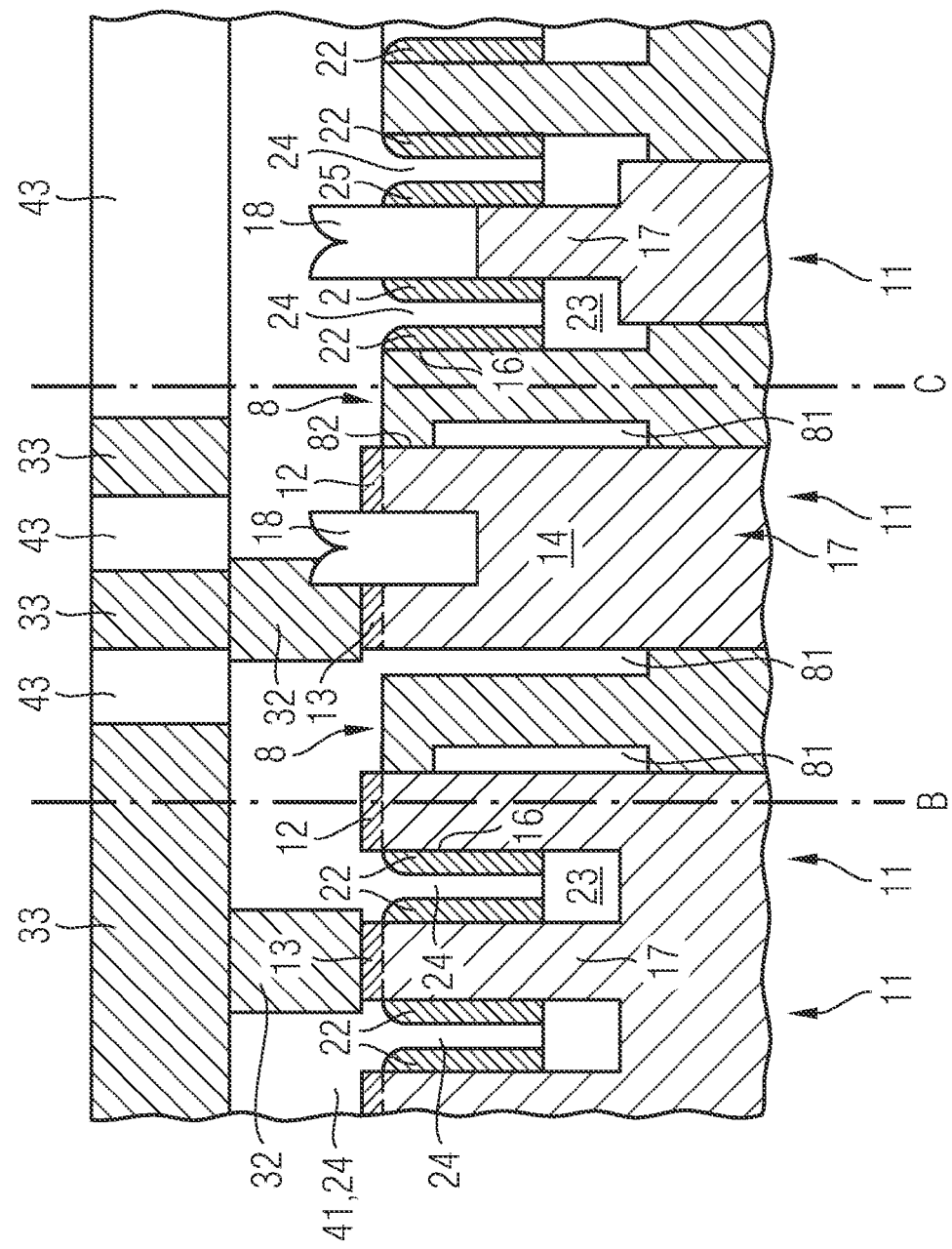
FIG. 5F illustrates a view of a corresponding conventional memory cell arrangement.

If the left-hand part of FIG. 5E is compared with the left-hand part of FIG. 5F, which illustrates the corresponding cross section through a known memory cell arrangement with a CFET, then it can be seen that the structure illustrated in FIG. 5E differs from the structure illustrated in FIG. 5F in particular by the fact that the word line trenches 20 are completely filled and, in contrast to the illustration in FIG. 5F, do not have two sidewall spacer structures which are isolated from one another by an insulator material 24 and form the first and the second gate electrode 2, 25 in known CFET structures.

The middle part of FIG. 5E is a cross section along a word line and perpendicular to the bit lines 33. Two trench capacitors 8 are arranged between the points B and C, the right-hand one of which trench capacitors is connected via a contact window (buried strap region) 82 to the first source/drain region 12 of the selection transistor. A recess trench 18 is arranged between the first source/drain region 12 and the second source/drain region 13, the function of which recess trench has been described above. The right-hand part of FIG. 5E illustrates a cross-sectional view of the memory cell arrangement according to the invention perpendicular to a word line trench and between two adjacent bit lines. If the right-hand part of FIG. 5E is compared with the right-hand part of FIG. 5F, which illustrates a corresponding cross section through the conventional memory cell arrangement, then it can be seen that each of the word line trenches 20 now contains only a single line, namely the word line associated with the first gate electrode 2 or the rear side electrode line associated with the rear side gate electrode 21. The structure has thus become considerably simpler since a word line insulator structure is no longer necessary either. The function of the memory cell arrangement is improved in comparison since overlap capacitances between closely adjacent word lines are avoided.

FIG. 6 illustrates a third embodiment of the present invention, in which the memory cell arrangement is constructed from a multiplicity of memory cells which in each case comprise a storage capacitor formed as a stacked capacitor and also a selection transistor realized as a CFET.

Figure 6A:
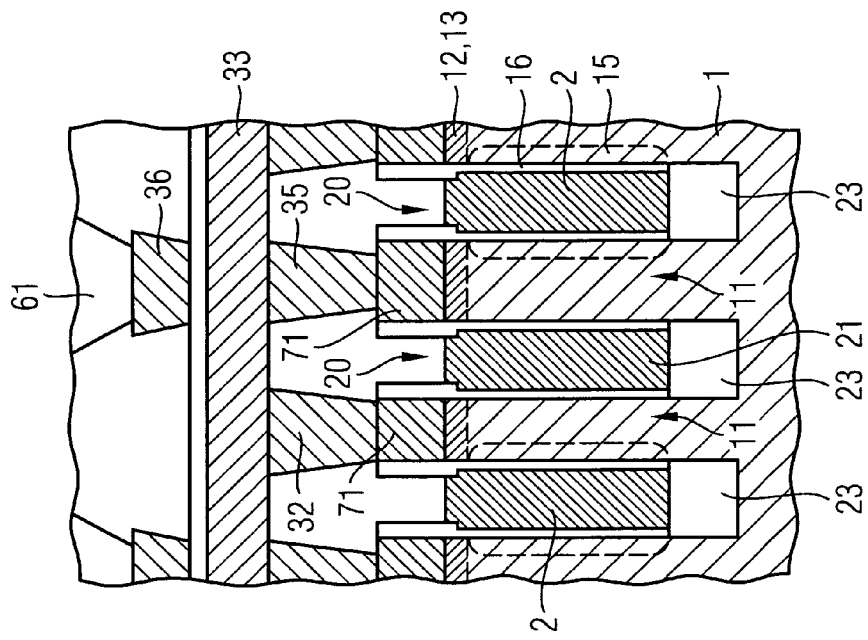
FIGS. 6A-6D illustrate a memory cell arrangement in accordance with a third embodiment of the present invention.
Figure 6B:
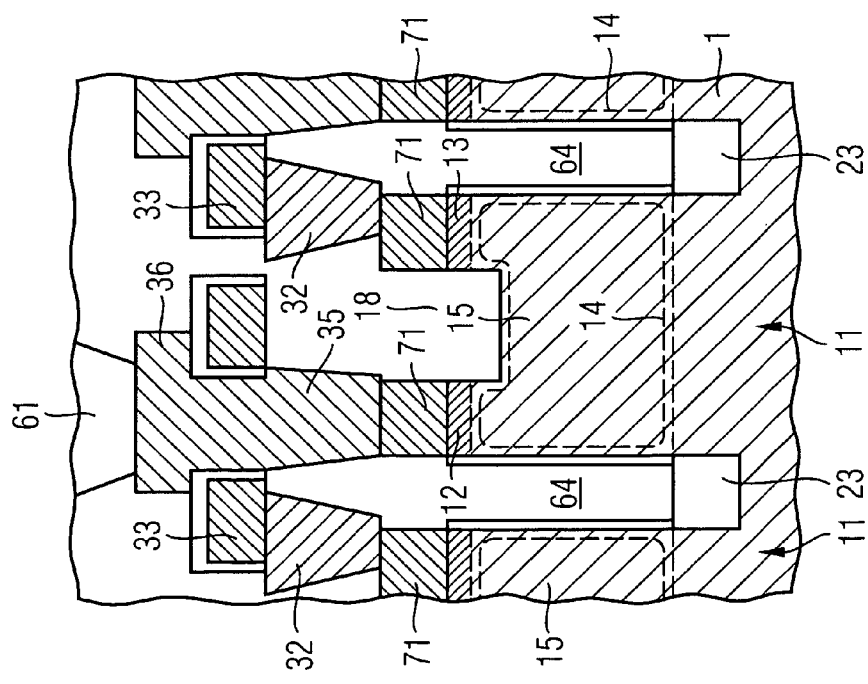

FIG. 6A illustrates a cross section through a memory cell along an X axis prescribed by the arrangement of the two source/drain regions 12, 13. FIG. 6B illustrates two memory cells arranged in two adjacent cell rows perpendicular to the X axis, the two source/drain regions 12, 13 of two respectively adjacent selection transistors being arranged offset relative to one another.

As illustrated in FIG. 6A, the active zones 11 of selection transistors that are respectively adjacent in a cell row are isolated from one another by cell insulator trenches 64. A first source/drain region 12 is arranged within the active zone 11 and is connected to a storage electrode 61 of a stacked capacitor via a section of an auxiliary structure 71 and a capacitor connection structure 35. A second source/drain region 13 is connected to a bit line 33 via a further section of the auxiliary structure 71 and via a bit line contact 32 adjoining the latter. The lower section of the cell insulator trenches 64 is filled with a bottom insulator structure 23. Between the two source/drain regions 12, 13, the semiconductor substrate 1 forms a body zone 14 in which a recess trench 18 is introduced into the semiconductor substrate 1 or the active zone 11.

As is illustrated in FIG. 6B, the active zones 11 are bordered along the X axis by a first gate electrode 2 and a rear side gate electrode 21, which are isolated from the semiconductor substrate 1 or the active zones 11 by a gate dielectric 16.

It is provided that the rear side gate electrodes 21 are held at a constant potential. If a suitable voltage is then applied to the first gate electrode 2, a conductive channel 15 that connects the two source/drain regions 12, 13 to one another is formed in the sections of the body zone 14 opposite the first gate electrode 2 at the gate dielectric 16. The effective channel length Leff of the channel 15 results from the depth of the filled recess trench 18. The effective channel width Weff of the channel 15 results from the distance between the lower edge of the recess structure in the recess trench 18 and the lower edge of the first gate electrode 2.

Figure 6C:
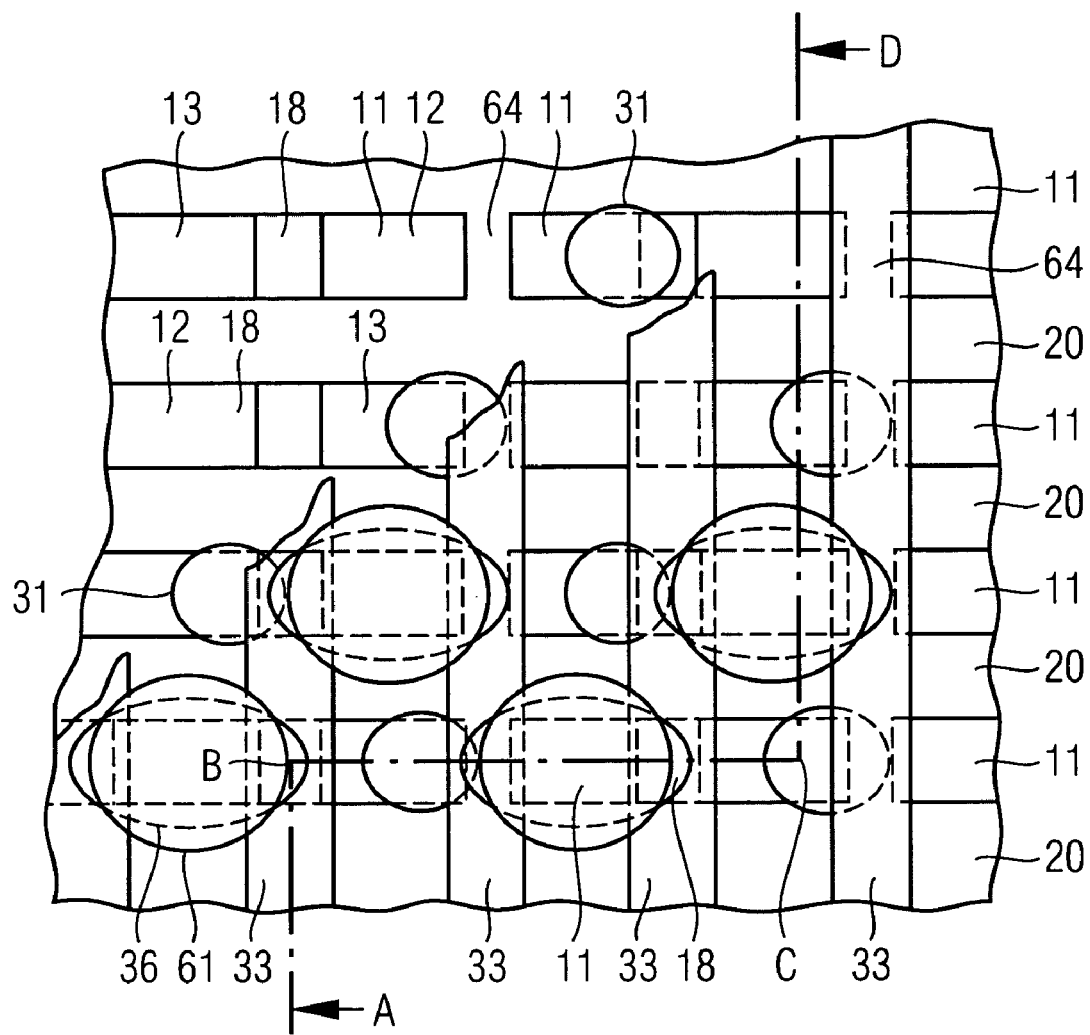

FIG. 6C illustrates a plan view of a detail from a memory cell array in accordance with a third embodiment of the present invention. In this case, the storage capacitors of the memory cells are formed as stacked capacitors 7. The memory cells are arranged in mutually orthogonal cell rows and cell columns and the storage capacitors are arranged within the cell rows and cell columns in each case alternately with selection transistors in a checkered fashion.

The active zones 11 of the selection transistors are illustrated in rectangular fashion and separated from one another within a row by narrow cell insulator trenches 64. Word line trenches 20 are introduced between the cell rows formed by the active zones 11 and the cell insulator trenches 64, said word line trenches having a larger width than the cell insulator trenches 64. The source/drain regions 12, 13 of the active zones 11 are in each case arranged along the row axis, corresponding to the X axis in FIG. 6A. The two source/drain regions 12, 13 of a respective active zone 11 are isolated from one another by a recess trench 18 having a smaller depth than the word line trenches 20 and the cell insulator trenches 64. Respectively adjacent source/drain regions 12, 13 of active zones 11 arranged in a cell column are assigned in each case alternately to a data line 33 and a stacked capacitor. The position of the stacked capacitors 7 results from the position of the respective storage electrodes 61, which in each case bears on a node pad 36 as upper termination of a capacitor connection structure.

The first source/drain regions 12 are connected to the storage electrode 61 of the respectively assigned stacked capacitor 7 via the capacitor connection structures. The second source/drain regions 13 are connected via bit line contacts 32 to data lines 33 routed between the bit line contacts 32 and an upper edge of the capacitor connection structures or node pads 36.

Figure 6D:
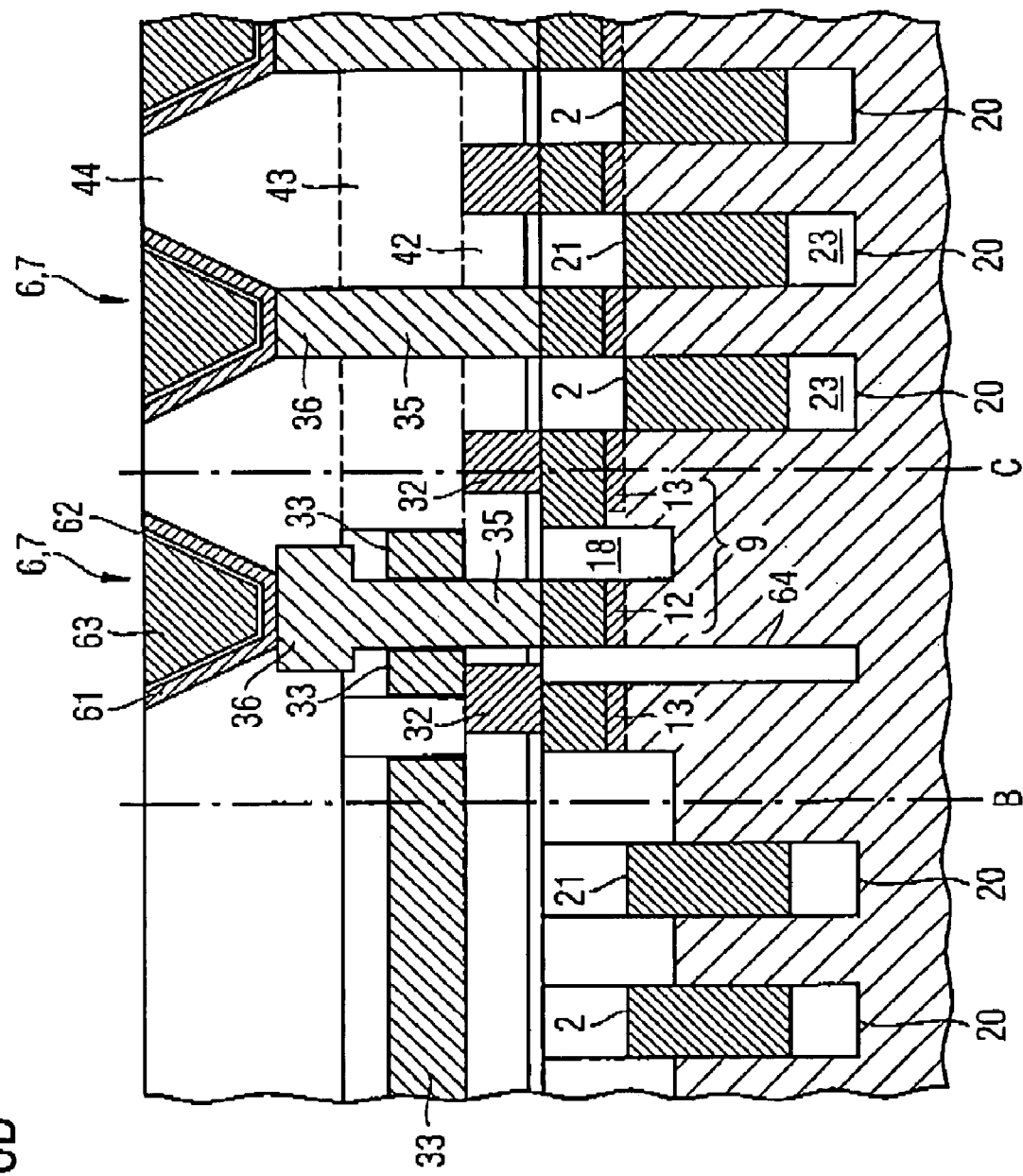

FIG. 6D illustrates a cross section along the line A-B-C-D in FIG. 6C.

In this case, the left-hand part of FIG. 6D illustrates a cross section along a bit line 33 perpendicular to two word line trenches 20. As can be seen in the left-hand part of FIG. 6D, the two word line trenches 20 are filled with only one electrode, either the first gate electrode 2 or the rear side gate electrode 21. Consequently, in contrast to the prior art, no side wall spacer structures that are isolated from one another by an insulation material are present on both side walls of the word line. The middle part of FIG. 6B between the points B and C illustrates a cross-sectional view along an active zone 11 perpendicular to the bit lines 33. The stacked capacitor 7 formed in the upper region comprises a storage electrode 61, a counterelectrode 63 and also a capacitor dielectric 62 arranged between the two capacitor electrodes 61, 63.

The storage capacitor 7 is connected to a first source/drain region 12 of a selection transistor via a node pad 36 and also a connection structure 35. A recess trench 18 is arranged between the first and the second source/drain region 12, 13 of the selection transistor 9, the function of which recess trench has been explained above. The second source/drain region 13 is connected to a bit line 33 via a bit line contact 32. The reference symbols 42, 43 and 44 in each case designate dielectric materials for the mutual insulation of bit lines and capacitors.

The right-hand part of FIG. 6D illustrates a cross section between the points C and D, that is to say between two bit lines perpendicular to the word line trenches 20. As can be seen in the right-hand part of FIG. 6D, the word line trenches 20 are filled with in each case only one electrode, namely the first gate electrode 2 or the rear side gate electrode 21. The gate electrode is in each case isolated from the body region 14 by a gate dielectric 16.

Figure 6E:
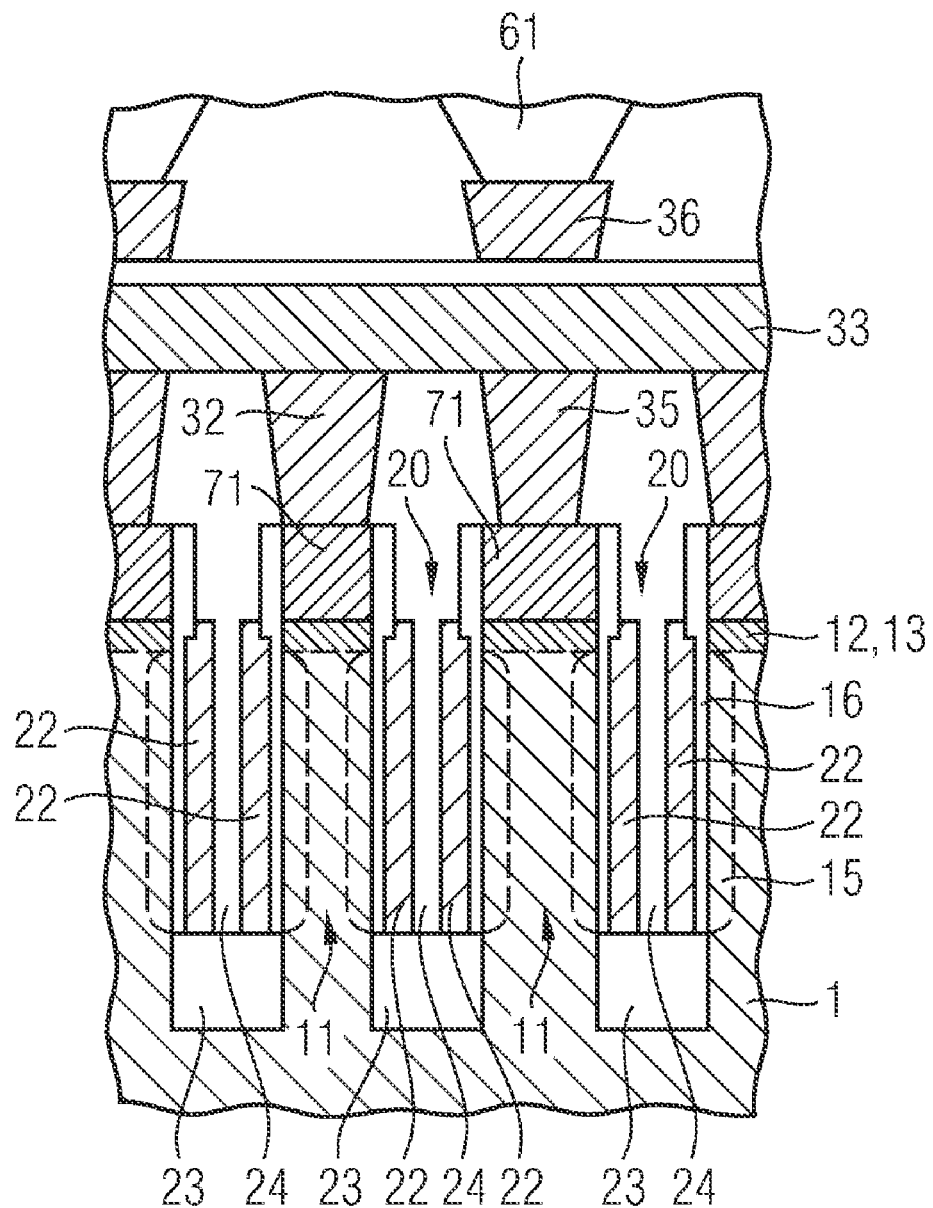
FIG. 6E illustrates a view of a corresponding conventional memory cell arrangement.

FIG. 6E illustrates for comparison an illustration of a conventional memory cell arrangement corresponding to FIG. 6B. Unlike the illustration in FIG. 6B, in the case of the conventional memory cell arrangement, a side wall spacer structure is formed in each case on the side walls in each of the word line trenches 20, and serves as first and second gate electrode 2, 25, respectively. More precisely, a first gate electrode 2 of a specific memory cell column and also a second gate electrode 25 of a preceding memory cell column are arranged in each word line trench 20. A word line insulator structure 24 is introduced between the side wall spacer structures within a word line trench 20. As emerges from the comparison of FIGS. 6B and 6E, the structure illustrated in FIG. 6B is significantly simpler to realize since only a single material has to be introduced into a word line trench.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell arrangement comprising:
a plurality of memory cells defined by a plurality of cell rows and cell columns, each cell column having a gate electrode; and
a plurality of word lines and rear side electrode lines arranged alternately between adjacent cell columns, wherein the gate electrodes of two adjacent cell columns are connected to a word line between the adjacent cell columns;
wherein the rear side electrode of adjacent cell columns are connected to a rear side line between the cell columns and the rear side line is held at a fixed potential.

2. A dynamic random access memory comprising:
a plurality of memory cells defined by a plurality of cell rows and cell columns, each cell column having a gate electrode, the memory cells formed in a semiconductor substrate, each memory cell having a storage capacitor for storing electrical charge and a selection transistor for driving the storage capacitor; and
a plurality of word lines and rear side electrode lines arranged alternately between adjacent cell columns, wherein the gate electrode of adjacent cell columns is connected to a word line between the adjacent cell columns;
wherein the rear side electrode of adjacent cell columns are connected to a rear side line between the cell columns and the rear side line is held at a fixed potential.

3. The memory of claim 2, wherein the rear side line is held at ground potential.

4. The memory of claim 2, wherein the storage capacitor is a trench capacitor formed in the semiconductor substrate.

5. The memory of claim 2, wherein the selection transistor comprises a vertical transistor, having a channel running perpendicular to a substrate surface of the semiconductor.

6. The memory of claim 2, wherein the storage capacitor comprises a stacked capacitor.

7. The memory of claim 2, wherein the selection transistor comprises a transistor having first and second source/drain regions isolated from one another via a nonconductive recess structure along an axis defined by the first and second source/drain regions.

8. The memory of claim 2, wherein the gate electrode and rear side electrode of the selection transistor extend along the axis at least from the second source/drain region and along a direction perpendicular to a substrate surface, to beyond the recess structure.

9. A memory cell arrangement comprising:
a plurality of memory cells defined by a plurality of cell rows and cell columns, each cell column having a gate electrode;
a plurality of word lines and rear side electrode lines arranged alternately between adjacent cell columns; and
means for connecting the gate electrode of adjacent cell columns to a word line between the adjacent cell columns, wherein the rear side electrode of adjacent cell columns are connected to a rear side line between the cell columns and the rear side line is held at a fixed potential.

10. A memory cell arrangement, comprising:
a multiplicity of memory cells arranged in cell rows and cell columns, formed in a semiconductor substrate and each memory cell contains a storage capacitor for storing electrical charge and a selection transistor for driving the storage capacitor;
a multiplicity of bit lines arranged in a first direction;
a multiplicity of word lines arranged in a second direction, which intersects the first direction;
a multiplicity of rear side electrode lines arranged in the second direction, the direction defined by the cell columns corresponding to the second direction, the word lines and rear side electrode lines being arranged in such a way that in each case one rear side electrode line lies between two word lines and in each case one word line lies between two rear side electrode lines;
the selection transistor comprising a first and a second source/drain region, a conductive channel that connects the first and the second source/drain region, a first gate electrode, which is suitable for controlling the conductivity of the conductive channel, and also a second rear side electrode opposite the first gate electrode;
the storage capacitor comprising two storage electrodes and also a storage dielectric arranged between the storage electrodes; and
the first source/drain region of each memory cell being connected to a storage electrode of the associated storage capacitor;
the second source/drain region of each memory cell being connected to a bit line, the bit line being suitable for transmitting the electrical charge read out, each word line arranged between two cell columns being connected to the first gate electrodes of the memory cells of the adjoining cell columns and being suitable in each case for driving the first gate electrodes for initiating a read-out operation; and
each rear side electrode line arranged between two cell columns being connected to the rear side electrodes of the memory cells of the adjoining cell columns and being suitable in each case for holding the rear side electrodes at a fixed potential.

11. The memory cell arrangement of claim 10, wherein the storage capacitors and the selection transistors are arranged in the manner of a checkerboard pattern, the selection transistors being assigned in each case to first arrays that are diagonally adjacent to one another and the storage capacitors being assigned in each case to diagonally adjacent second arrays situated in between.

12. The memory cell arrangement of claim 10, wherein the storage capacitors comprise trench capacitors formed in the semiconductor substrate.

13. The memory cell arrangement of claim 10, wherein the selection transistor is embodied as a vertical transistor, the channel of which runs perpendicularly to a substrate surface of the semiconductor substrate.

14. The memory cell arrangement of claim 10, wherein the storage capacitor is embodied as a stacked capacitor above a substrate surface of the semiconductor substrate.

15. The memory cell arrangement of claim 10, wherein the selection transistor is embodied as a transistor whose first and second source/drain regions are isolated from one another by a nonconductive recess structure along an X axis defined by the first and second source/drain regions.

16. The memory cell arrangement of claim 15, wherein the first gate electrode and the rear side electrode of the selection transistor in each case extend along the x axis at least from the first as far as the second source/drain region and along a direction perpendicular to the substrate surface in each case at least from the underside of the first and the second source/drain region to beyond a lower edge of the recess structure.

17. The memory cell arrangement of claim 10, wherein word line trenches are arranged between two cell columns, a word line and a rear side electrode line being arranged alternately in the word line trenches.

18. The memory cell arrangement of claim 10, wherein at least two rear side electrode lines are connected to one another.

19. A method for operating a memory cell arrangement comprising:

defining the memory cell arrangement to comprise a memory comprising a plurality of memory cells defined by a plurality of cell rows and cell columns, each cell column having a gate electrode, the memory cells formed in a semiconductor substrate, each memory cell having a storage capacitor for storing electrical charge and a selection transistor for driving the storage capacitor, and a plurality of word lines and rear side electrode lines arranged alternately between adjacent cell columns, wherein the gate electrode of adjacent cell columns is connected to a word line between the adjacent cell columns;

applying a voltage that remains constant to all the rear side electrode lines; and initiating a read-out operation by applying a voltage to a word line to which the first gate electrode of the memory cell to be read is connected, the voltage being suitable for controlling the first gate electrode of the selection transistor of the memory cell in such a way that the conductive channel becomes conductive, as a result of which the content of all the memory cells whose first gate electrode is connected to the word line is read out.

* * * * *